United States Patent [19]

Sako

[11] Patent Number: 5,298,806
[45] Date of Patent: Mar. 29, 1994

[54] INTEGRATED CIRCUIT AND GATE ARRAY

[75] Inventor: Norimitsu Sako, Chiba, Japan

[73] Assignee: Kawasaki Steel Corporation, Hyogo, Japan

[21] Appl. No.: 773,220

[22] Filed: Oct. 9, 1991

[30] Foreign Application Priority Data

Oct. 12, 1990 [JP] Japan .................. 2-274174

[51] Int. Cl.[5] .......................................... H03K 19/173
[52] U.S. Cl. .................................. 307/465; 307/521; 330/86
[58] Field of Search ................. 307/443, 465, 465.1, 307/303, 303.1, 521, 482.1; 357/45; 330/86, 782

[56] References Cited

U.S. PATENT DOCUMENTS

| | | | |
|---|---|---|---|
| 4,542,349 | 9/1985 | Hoeft | 330/86 |
| 4,628,276 | 12/1986 | Mizutani | 330/86 |
| 4,773,088 | 9/1988 | Matheny | 379/395 |
| 4,785,253 | 9/1988 | Hughes | 307/521 |
| 4,792,990 | 12/1988 | Beyers, Jr. | 455/234 |
| 4,857,778 | 8/1989 | Hague | 307/521 |
| 5,053,650 | 10/1991 | Ohkubo et al. | 307/521 |
| 5,107,146 | 4/1992 | El-Ayat | 307/465 |

FOREIGN PATENT DOCUMENTS

| | | |
|---|---|---|
| 0144143 | 6/1985 | European Pat. Off. . |
| 0163409 | 12/1985 | European Pat. Off. . |
| 0297818 | 1/1989 | European Pat. Off. . |
| 0326251 | 8/1989 | European Pat. Off. . |
| 2737466 | 2/1979 | Fed. Rep. of Germany . |
| 2029142 | 3/1980 | United Kingdom . |
| 2151356 | 7/1985 | United Kingdom . |
| 2240675 | 8/1991 | United Kingdom . |

OTHER PUBLICATIONS

A CMOS Field-Programmable Analog Array, Edward K. F. Lee, P. Glenn Gulak, Department of Electrical Engineering of Toronto, Toronto, Canada, Feb. 1991 "IEEE International Solid-State Circuits Conference", pp. 186-187.

Francis Verlag, Munchen, "Verstarkungsfaktor prazise digital programmieren", Electronic, vol. 14, pp. 75-78, Jul. 13, 1984.

Primary Examiner—Edward P. Westin
Assistant Examiner—Andrew Sanders
Attorney, Agent, or Firm—Oliff & Berridge

[57] ABSTRACT

An integrated circuit or a gate array having a logic gate block functioning in accordance with circuits defined in the interior and data, which circuit includes an analog circuit, a passive electronic element array capable of changing circuit parameters of the analog circuit, an analog switch element capable of switching an analog signal by a digital signal, a variable characteristics analog circuit capable of defining and changing the circuit arrangement and the circuit characteristics, and a digital circuit capable of controlling the defining and the changing of the circuitry.

14 Claims, 9 Drawing Sheets

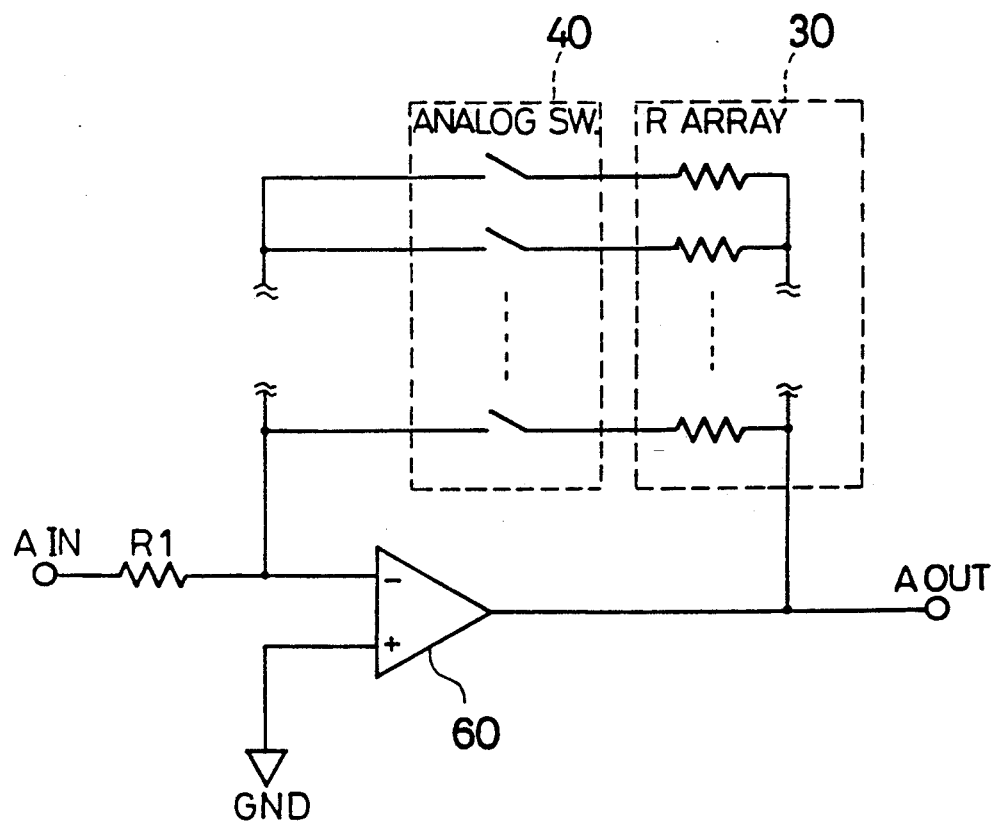
F I G. 2

F I G. 3
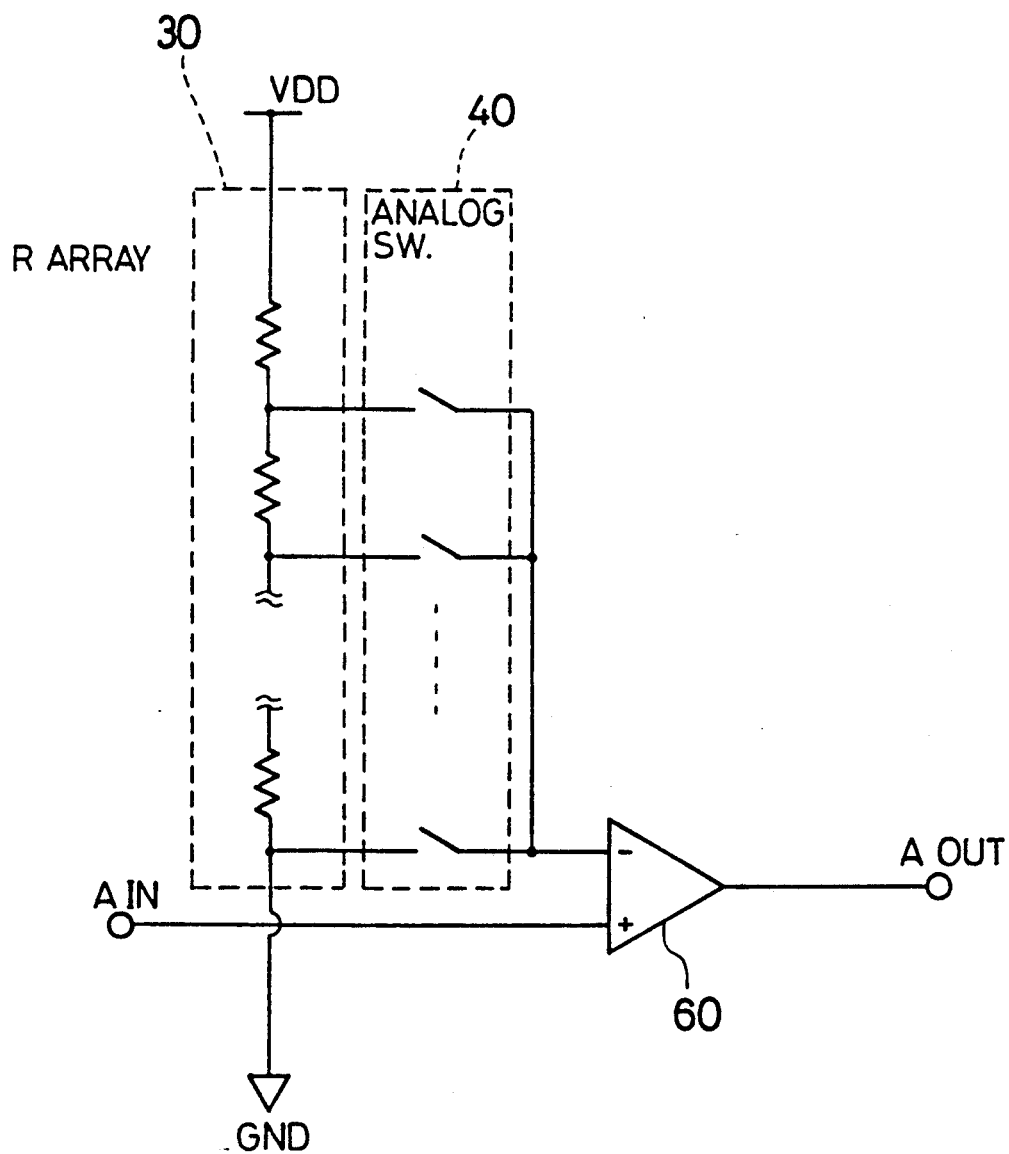

F I G. 6
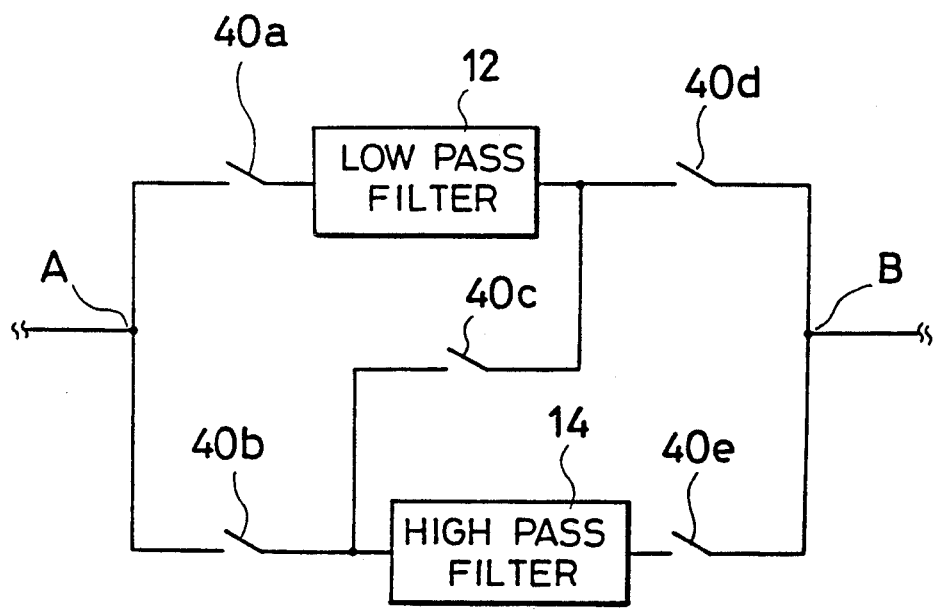

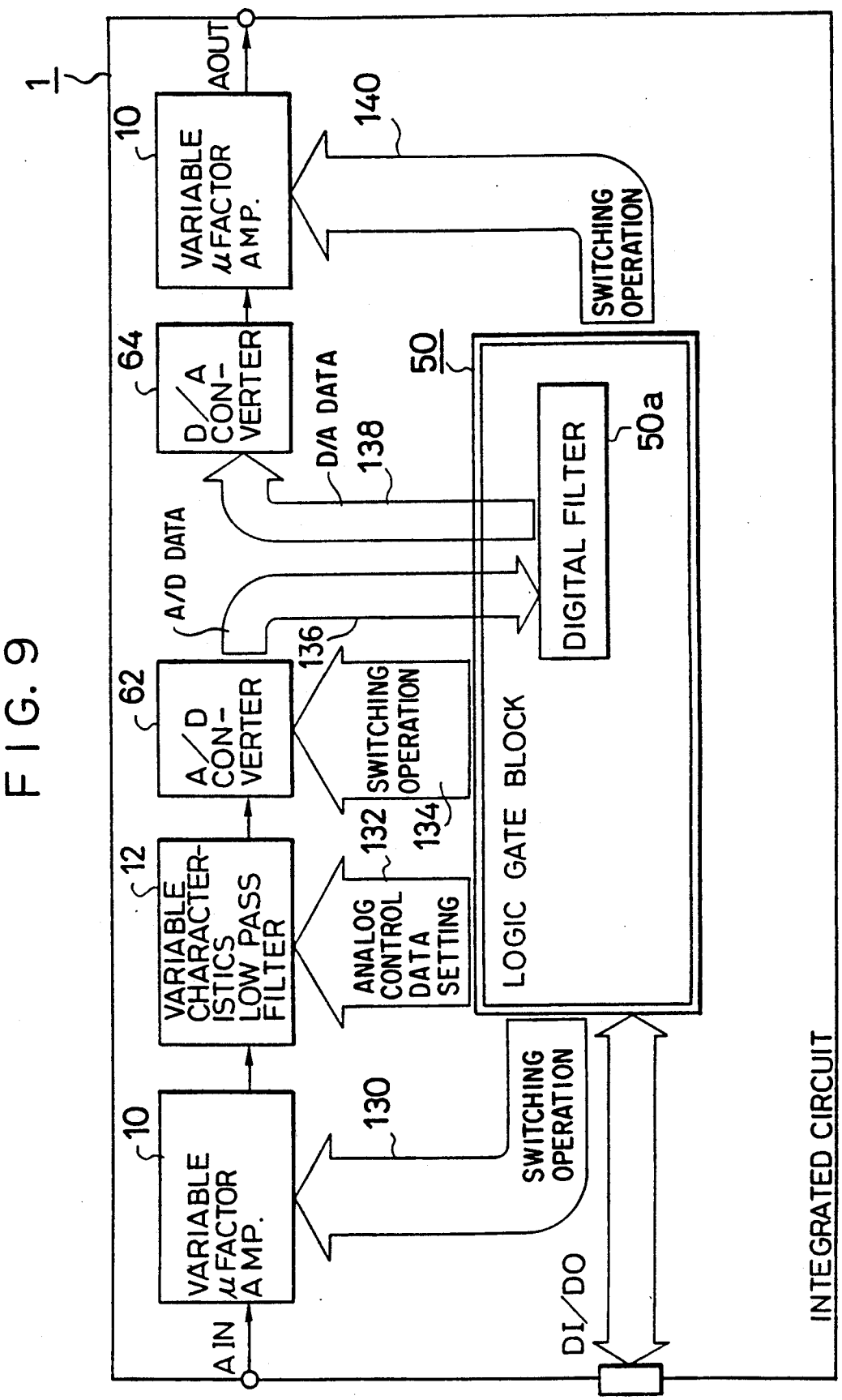
F I G. 9

INTEGRATED CIRCUIT AND GATE ARRAY

BACKGROUND OF THE INVENTION

1. Field of the Invention

The present invention relates to an integrated circuit having a logic gate block functioning in accordance with circuits defined in the interior thereof and data, or a gate array for applying wirings to a master slice in accordance with the application, and more particularly to an integrated circuit and a gate array improved in efficiency of design of an analog-digital composite electronic circuits.

2. Description of the Prior Art

There has heretofore been widely used a programmable logic device (hereinafter referred to as a "PLD") which is an integrated circuit formed to realize an optional logic circuit near at hand of a user. The PLD of various types are provided for the users.

The application in the interior of the above-described PLD is performed such that various memory elements and various logic elements are selectively connected to one another. As the means (elements) used for programming a logic circuit, N-MOS transistors and P-MOS transistors are used as switching elements. The means selectively connected to one another for programming the logic circuit will hereafter be referred to as Switching Station (S/S) elements.

Applying the integrated circuits to electronic machines and components leads to the many advantages of not only rendering the whole sizes of the electronic machines and components compact but also improved reliability of the electronic machines and components, lowered electric power consumption and so forth. Accordingly, many users utilize the above-described PLD to facilitate the circuit designing of the integrated circuit for widely applying the integrated circuits to the electronic machines and components. Along with this trend, various electronic circuits of the electronic machines and components are selected as the targets for developing and providing the PLD of various types.

In recent years, the digital circuit technique has achieved a great advancement in the respects of the improvement in mounting density of logic devices and the improvement in signal processing speeds. Along with this trend, the electronic circuits and the electronic circuit devices, which have heretofore been using the analog circuit technique, are formed by the digital circuit technique, so that not only the electronic circuits and the electronic circuit devices are rendered compact in size and the electric power consumption is decreased as described above, but also the number of the electronic parts being used can be reduced and the number of corrected portions such as the trimmer can be decreased, thus improving the manufacturing efficiency and improving the reliability of the whole electronic circuits.

Further, it has been realized as a result of the advancement of the size-reducing technique of the integrated circuits that a digital circuit obtained by digitalizing an analogue circuit and a concerned analog circuit formed together with the digital circuit can be formed on one and the same integrated circuit. As the methods of realizing the integrated circuit formed of the above-described analog-digital composite electronic circuit, the following forming methods have been proposed.

1. An integrated circuit (a building-block type standard cell) in which a logical circuit (digital circuit), a memory and an analog circuit are formed to provide macrocells, respectively, and these macrocells are integrated on one chip.

2. An integrated circuit (a multichip-module) in which a logic circuit (digital circuit), a memory and an analog circuit are formed to provide integrated circuit chips independently of one another, and these plurality of integrated circuit chips are mounted onto a polyimide pattern or a silicone substrate having programmable wiring.

3. An integrated circuit (a waferscale integration) in which a system consisting of a logic circuit (a digital circuit), a memory and an analog circuit is integrated on the whole surface of a wafer.

However, the integrated circuit in which an analog-digital composite electronic circuit is integrated on one chip as described above presents the problem that a very long time is required for developing such an integrated circuit as described above, the problem that an enormous cost of development is required, and so forth.

Since the analog signal is the signal having the meaning in the continuously varied value itself (of voltage and current), in controlling this analog signal, a digital signal having the bit number far more than the bit number for a mere on-off control. Accordingly, in the integrated circuit in which the analog-digital composite electronic circuit is integrated on one chip, such a problem is presented that the number of the wirings of the digital signals for controlling the analog signals becomes very large.

SUMMARY OF THE INVENTION

The present invention has been developed to obviate the above-described problems and has as its first object the provision of an integrated circuit and a gate array having a logic gate block functioning in accordance with circuits defined in the interior thereof and data, wherein an analog-digital composite electronic circuit can be formed on one chip, and defining and changing in the respective analog circuits and digital circuits or in the functions, arrangements and wirings, all of which are concerned with one another are facilitated, so that the time and cost for the development can be reduced, the reliability can be improved, the electric power consumption can be decreased, and the size can be rendered compact and the performance can be highly improved.

Furthermore, the present invention has as its second object, in addition to the first object, the number of wirings (signal lines) within the integrated circuit and the gate array can be reduced, the degree of integration of electronic circuits using the above-described integrated circuit and the gate array and the efficiency of designing can be improved and the time and cost for the development can be reduced.

To achieve the above-described first object, according to the present invention, in the integrated circuit having the logic gate block functioning in accordance with the circuits defined in the interior thereof and the data, the integrated circuit comprises an analog circuit for processing an analog signal, a passive electronic element array capable of changing circuit parameters of the analog circuit and an analog switch element capable of switching an analog signal by a digital signal so as to define and change the connection arrangement of the analog circuit and the passive electronic element array, or to vary the circuit parameters by the passive electronic element array, and, a variable characteristics analog circuit capable of defining and changing the circuit arrangement and the circuit characteristics and a digital circuit capable of controlling the defining and the changing the logic are realized in one package.

Furthermore, to achieve the above-described first object, according to the present invention, the said analog switch element makes switching of an analog signal in accordance with memory data of a digital memory element provided in association with the said analog switch element.

Furthermore, to achieve the above-described second object, according to the present invention, bit data corresponding to the number of a plurality of the digital memory elements provided in association with a plurality of the analog switch elements are serially written in.

Furthermore, to achieve the above-described second object, according to the present invention, m×n of the said digital memory elements provided in association with m×n of the said analog switch elements is a memory in which the number of words is m and the number of bits per word is n.

Furthermore, to achieve the above-described first object, according to the present invention, in a gate array for applying wirings to a master slice, in which basic cells each consisting of a plurality of transistors are arranged, in accordance with the application, includes an analog circuit for processing an analog signal, a passive electronic element array capable of changing circuit parameters of the said analog circuit, and an analog switch element capable of switching an analog signal by a digital signal so as to define and change the connection arrangement of the said analog circuit and the said passive electronic element array, or to vary circuit parameters by the said passive electronic element array, and, a variable characteristics analog circuit capable of defining and changing the circuit arrangement and the circuit characteristics and a digital circuit capable of controlling the defining and the changing the logic are realized in one package.

Furthermore, to achieve the above-described first object, according to the present invention, the said analog switch element makes the switching of an analog signal in accordance with memory data of a digital memory element provided in association with the said analog switch element and the digital memory element is constituted by a plurality of basic cells of the said master slice.

Furthermore, to achieve the above-described first object, according to the present invention, the said analog circuit is constituted by one or more basic cells of the said master slice.

According to the present invention, in the integrated circuit having the logic gate block functioning in accordance with the circuits defined in the interior thereof and the data, i.e., the integrated circuit which has conventionally been referred to as PLD or the like, an analog circuit for processing an analog signal is provided as well, and the arrangement and the circuit parameters of this analog circuit can be changed in accordance with the circuits defined in the interior of this integrated circuit and the data.

Furthermore, according to the present invention, in the master slice type integrated circuit wherein the basic cells constituting the logic gate block are arranged, namely, in the integrated circuit, which has conventionally been referred to as the gate array or the like, an analog circuit for processing an analog signal is provided as well, and the arrangement of this analog circuit and the circuit parameters can be changed in accordance with the circuits defined in the interior of this integrated circuit and the data.

Furthermore, according to the present invention, changes in wiring connections for changing the arrangement, function and characteristics of an analog circuit portion formed by the analog circuit can be easily performed by use of an analog switch capable of switching an analog signal by a digital signal.

Accordingly, defining and changing of the connection arrangements of an analog circuit such for example as an analog amplifier and passive electronic element arrays such as a resistance array (hereinafter referred to as an "R array"), a capacitance array (hereinafter referred to as a "C array"), an inductance array (hereinafter referred to as an "L array"), and so forth can be very easily performed.

Further, taps of these passive electronic element arrays are changed over by an analog switch element, so that the characteristics of the analog circuit can be varied.

According to the integrated circuit of the present invention as described above, not only in the logic circuit (digital circuit), but also in the analog circuit, defining and changing in the arrangement, function and characteristics of the circuit can be easily performed. Accordingly, the time and cost for the development of the analog-digital composite electronic circuit can be reduced.

Furthermore, according to the integrated circuit of the present invention as described above, not only the electronic circuit device for processing an analog signal as a whole can be rendered compact in size and the performance thereof can be improved, but also the reliability can be improved and the electric power consumption can be reduced.

When an on-off signal of the digital signal flows through a wiring for transmitting a digital signal disposed close to a wiring for transmitting an analog signal, there is presented the problem that noises induced by the digital signal are superimposed on this analog signal.

According to the present invention, for the purpose of reducing the problems of noises as described above, a digital memory element is provided in association with the said analog switch element so as to reduce the frequency of on-off change-over of the digital signal to an analog switch element provided in association with the change-over of an analog signal line or eliminate the on-off change-over, and switching of the said analog switch element is performed in accordance with memory data of this digital memory element.

When the above-described analog switch element defines the arrangement of the analog circuit, such for example as the connection arrangement between the analog amplifier, the passive electronic element array and the like, this defining is performed prior to the use of this analog circuit, and, normally, it is possible not to change during the use of this analog circuit. Accordingly, when redefining (changing) of the function, arrangement and the like is not performed during the use of the analog circuit, the noises to the analog signal induced by the digital signal can be reduced.

Furthermore, when the frequency of on-off change-over of the digital signal to the analog switch element is reduced as described above, the digital processing pertaining to this digital signal can be reduced. Further, when the integrated circuit is mounted onto an electronic circuit board for example, if the arrangement, function and characteristics of the analog circuit are defined by the analog switch element and the digital memory element, namely, if data are written into the digital memory element for the above-described defining of the analog circuit prior to the use of this integrated circuit, a circuit on this integrated circuit or the electronic circuit board which should be prepared by a user for this defining becomes not necessary at all.

Furthermore, in designing the analog circuit portion, the inventor of the present invention pays his attention to that there are many delicate adjustings such as a dynamic range, the characteristics of a filter, correction of an offset voltage and the like.

For example, there is a case where the provision of digital signals of 32 bits is needed for delicately adjusting a part in the analog circuit portion as described above. Further, in a low pass filter as shown in FIG. 5, capable of varying the characteristics obtained by use of the R array (fixed value in FIG. 5) and the C array in the analog amplifier, it is necessary to adjust the resistance value for varying a mu factor, a resistance value for correcting an offset voltage, a capacitor value, the number of stages of filters, the characteristics of filters or the like, so that many digital signals are required at all times.

In order to obviate the problem of the increased digital signals as described above, the inventor of the present invention outputs the digital signals being low in the frequency of defining and changing or not requiring the high speed in defining and changing, e.g., the digital signals for controlling the analog switch elements used only for the time of the initial defining of the analog circuit, through a plurality of digital memory elements provided in association with these analog switch element, and writes in serially the bit data of the plurality of digital memory elements.

Accordingly, the number of signal lines of the digital signals to the respective digital memory elements for controlling the analog switch elements can be greatly decreased, thus improving the degree of integration of the integrated circuit. Furthermore, with this arrangement, the influence of the noises of the digital signal to the analog signal can be reduced.

Furthermore, for example, when a multiplicity of stages of the low pass filters and the like capable of varying the characteristics by correcting the capacitance value and the like through the analog switch elements are used, the analog switch elements for these multiplicity of stages of the low pass filters must be further increased in number.

In the above-described case, by use of the digital memory elements arranged in the number of m×n, namely, SRAM (static range access memory), EE-PROM (electrically erasable and programmable read only memory) and the like having n bits per word and m words, the inventor of the present invention has found that the bit data of m×n of the analog switch elements can be rewritten efficiently only with the signal lines being small in number.

For example, 320 signal lines have heretofore been used for on-off controlling of 32 bits×10 of the analog switch elements, however, by use of the SRAM and the like as described above, for example, only 8 of the digital data lines and 6 of the address lines, totalling to 14 of the signal lines to the SLAM and like can control the analog switch elements, namely, data can be written in this SRAM and the like. Namely, in the case of this example, the number of the wirings for the digital signals in the integrated circuit can be decreased by more than 1/20.

As has been described hereinabove, according to the present invention, in designing the analog-digital composite electronic circuit, such outstanding effects can be obtained that the analog circuit and the digital circuit, or the relative arrangements, functions and characteristics therebetween can be easily changed, the time and cost for the development can be reduced, the reliability can be improved and the power consumption can be reduced due to the reduction and the like of the electronic circuit parts used, and further, the analog-digital composite electronic circuit can be rendered compact in size and improved in performance.

Furthermore, in the case where switching of the analog signal is made by the digital signal, and the digital memory element for determining the switching state of the analog switch element is provided in association with the analog switch element for performing defining, changing and the like of the connection arrangement between the analog circuit and the passive electronic element array, such an effect can be attained that the noises induced by the digital signal to the analog signal can be reduced.

Furthermore, in the case where write-in of the bit data into this digital memory element is performed serially or in units of words per predetermined bit number, such outstanding effects can be attained that the number of signal lines to a plurality of analog switch elements and a plurality of digital memory elements from the digital circuit can be reduced and the degree of integration of the integrated circuit can be improved.

BRIEF DESCRIPTION OF THE DRAWINGS

The preferred embodiments will be described with reference to the drawings, wherein like elements have been denoted throughout the figures with like reference numerals, and wherein:

FIG. 2 is a circuit diagram showing an example of the first embodiment of the variable mu factor amplifier according to the present invention;

FIG. 3 is a circuit diagram showing a modified example of the first embodiment of the variable mu factor amplifier according to the present invention;

FIG. 6 is a block diagram showing a third embodiment of the present invention;

FIG. 9 is a block diagram showing a sixth embodiment of the present invention.

DESCRIPTION OF THE PREFERRED EMBODIMENTS

Embodiments of the present invention will hereunder be described in detail with reference to the accompanying drawings.

Figure 1:
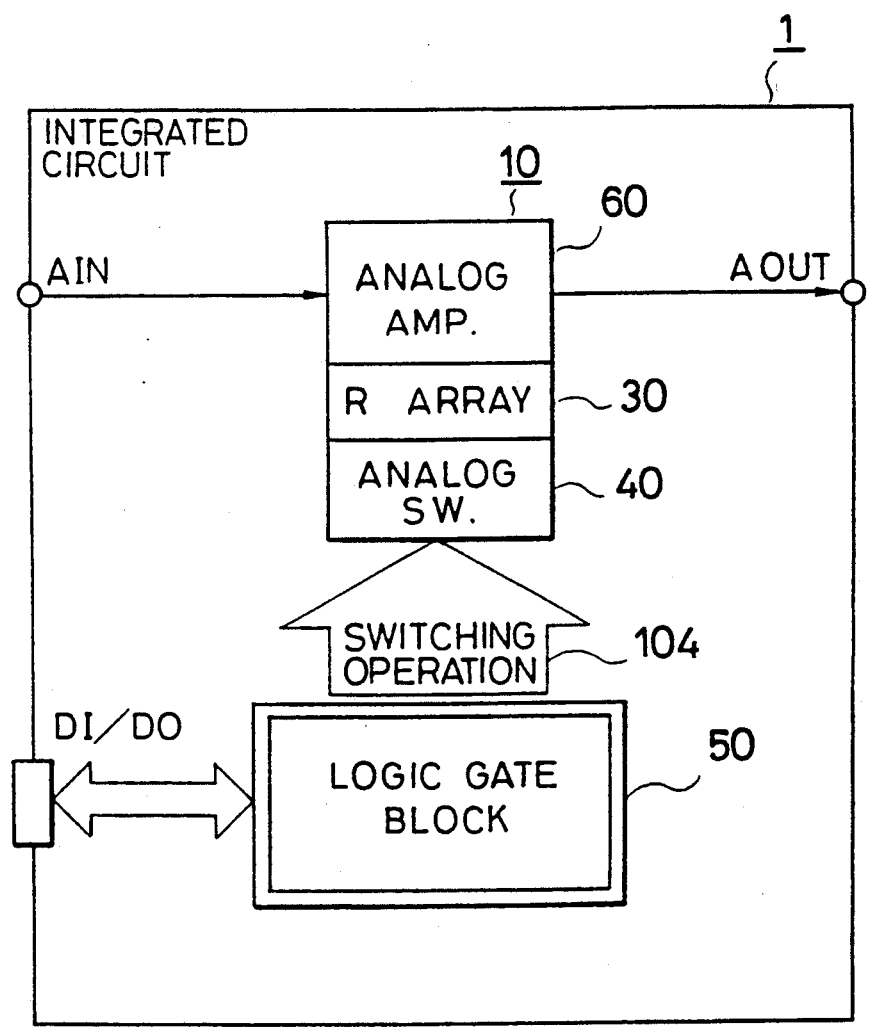
FIG. 1 is a block diagram showing a first embodiment of the present invention.

FIG. 1 is a block diagram showing a first embodiment of the present invention.

Referring to this FIG. 1, an integrated circuit 1 is constituted by a variable mu factor amplifier 10 and a logic gate block 50 for carrying out the switching operation 104 and the like for this variable mu factor amplifier 10.

Furthermore, this variable mu factor amplifier 10 is constituted by an analog amplifier 60, an R array 30 and an analog switch 40.

An analog signal to this integrated circuit 1 from outside is inputted through an analog signal input terminal AIN, and inputted into the variable mu factor amplifier 10. The analog signal outputted from the variable mu factor amplifier 10 is outputted to the outside of the integrated circuit 1 through an analog signal output terminal AOUT. Furthermore, inputting and outputting of digital signals of the logic gate block 50 to and from the outside of the integrated circuit 1 are carried out through a digital signal input-output terminal DI/DO.

According to the above-described first embodiment of the present invention, the mu factor of the analog amplifier 60 can be easily changed by the switching operation 104, the analog switch 40 and the R array 30. Furthermore, a logic circuit capable of varying this mu factor can be easily defined and changed by defining a circuit in the logic gate block 50 and the data.

FIG. 2 is a circuit diagram showing an example of the first embodiment of the variable mu factor amplifier 10 according to the present invention.

Referring to this FIG. 2, a feedback resistance value of the analog amplifier 60 is determined by a resistance value of the R array 30 switched by the analog switch 40. Accordingly, in this example of the variable mu factor amplifier 10 shown in FIG. 2, the mu factor of the analog amplifier 60 can be varied by switching the R array 30 through the analog switch 40 in accordance with a ratio with a resistor R1.

Incidentally, in this FIG. 2, reference characters AIN and AOUT designate those having the same reference characters in FIG. 1.

As has been described hereinabove, according to the first embodiment of the present invention, the mu factor of the variable mu factor amplifier 10 can be easily made variable, and moreover, a logic circuit of the logic gate block 50 for performing the switching operation 104 and the like for adjusting the mu factor of this variable mu factor amplifier 10 can be easily defined and changed. Accordingly, in the integrated circuit of this type, a desirable analog amplifier can be easily obtained.

FIG. 3 is a circuit diagram showing a variable reference value comparator which is a modified example of the first embodiment of the variable mu factor amplifier 10 according to the present invention.

Referring to this FIG. 3, reference characters AIN and AOUT designate those having the same reference charactors in FIG. 1. Furthermore, reference character VDD designates a power source line, and GND a ground line.

In this FIG. 3, the analog amplifier 60 is formed of a comparator. Namely, inputted into a minus input terminal of this analog amplifier 60 is a divided voltage of a power source voltage of the R array 30 switched by the analog switch 40. This voltage inputted into the minus input terminal of the analog amplifier 60 is compared with a voltage inputted from the analog signal input terminal AIN and inputted into a plus input terminal of this analog amplifier 60, and then, the result is outputted to the analog signal output terminal AOUT.

According to the modified example of the variable mu factor amplifier 10 shown in FIG. 3, a comparator in which a reference value is made variable can be realized.

Figure 4:
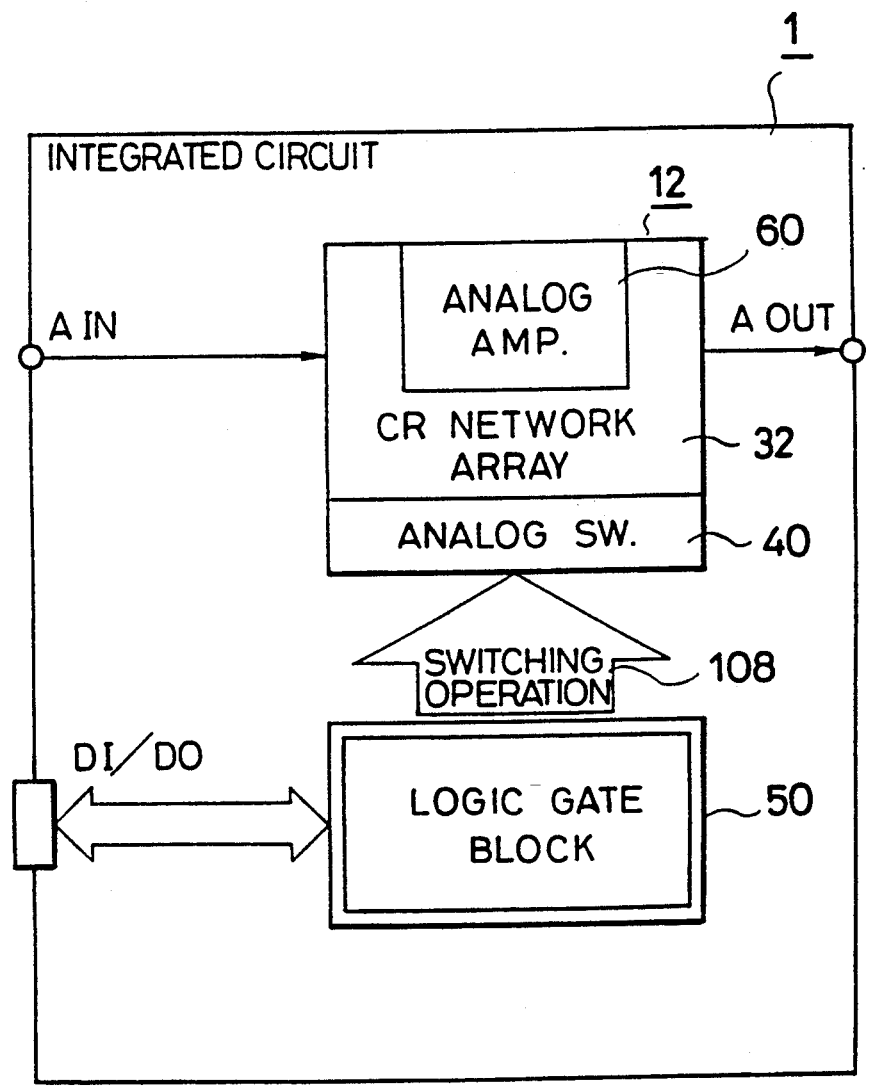
FIG. 4 is a block diagram showing a second embodiment of the present invention.

FIG. 4 is a block diagram showing a second embodiment of the present invention.

Referring to this FIG. 4, reference characters 40, 50, 60, AIN, AOUT and DI/DO designate those having the same reference characters in FIG. 1.

In this FIG. 4, a variable characteristics low pass filter 12 is constituted by the analog switch 40, a CR network array 32 and the analog amplifier 60. Furthermore, this CR network array 32 consists of pluralities of C arrays and R arrays which can be switched by the analog switch 40.

In this variable characteristics low pass filter 12, cutoff frequencies and a mu factor can be changed by the logic gate block 50 through a switching operation 108. Accordingly, in the integrated circuit of this type, a desirable low pass filter can be easily obtained.

Figure 5:
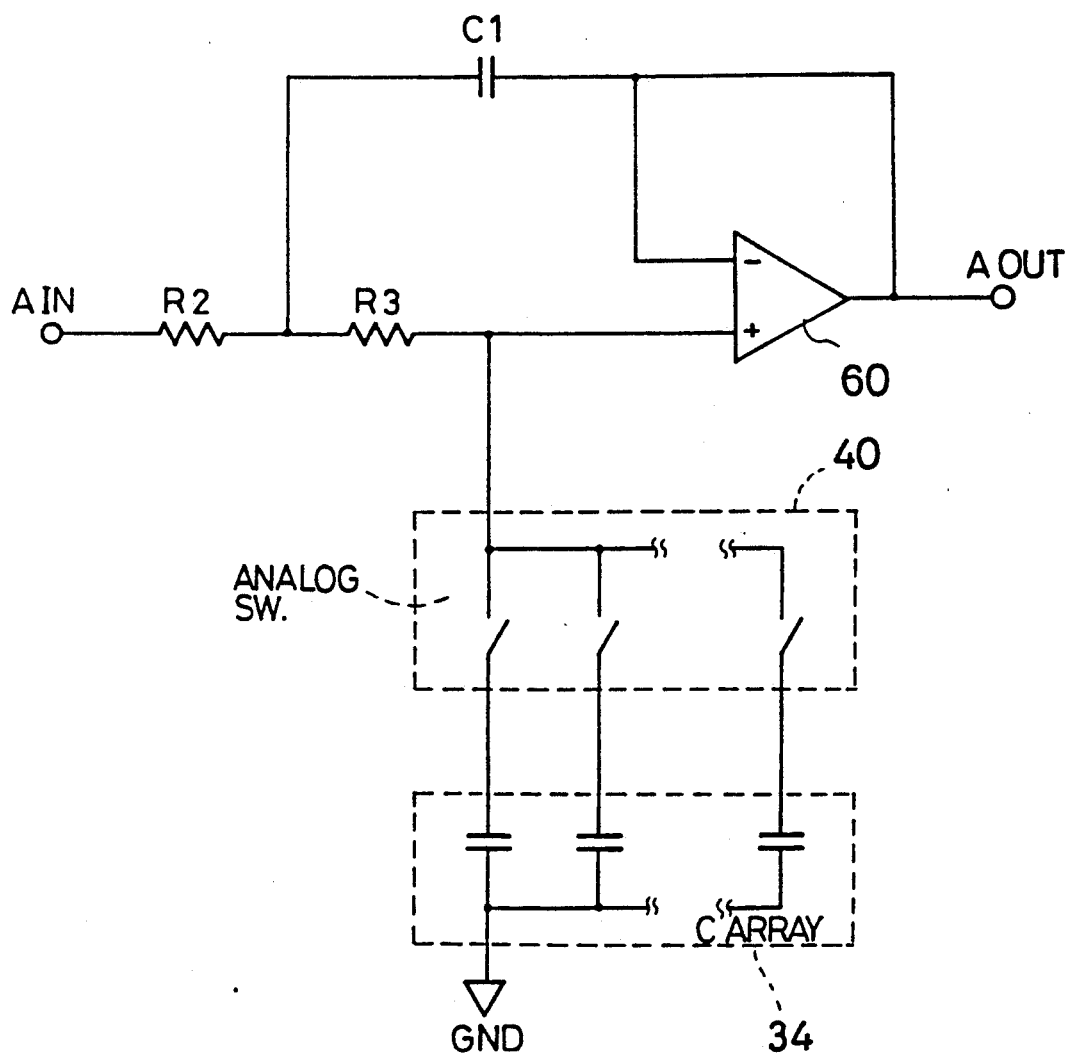
FIG. 5 is a circuit diagram showing an example of the second embodiment of the variable characteristics low pass filter according to the present invention.

FIG. 5 is a circuit diagram showing an example of the second embodiment of the variable characteristics low pass filter 12 according to the present invention.

Referring to this FIG. 5, reference characters AIN and AOUT designate those having the same reference character in FIG. 4.

In this FIG. 5, an active low pass filter is constituted by the analog amplifier 60, resistors R2, R3, a capacitance C1 and a C array 34 in which a capacitance is varied by switching of the analog switch 40. Furthermore, resistance value of possible R array is fixed to R3.

The cutoff frequencies of this low pass filter can be changed by switching the analog switch 40. Incidentally, this analog switch 40 shown in FIG. 5 can perform the switching operation by the logic gate block in the same manner as the analog switch 40 in FIG. 4.

As has been described hereinabove, according to the second embodiment of the present invention, the desirable low pass filter can be easily obtained and the cutoff frequencies of this low pass filter can be varied as well.

FIG. 6 is a block diagram showing a third embodiment of the present invention.

Between reference character A and B in this FIG. 6, the low pass filter 12 and a high pass filter 14 can be changed in their connection relationship by analog switch elements 40a-40e controlled by the logic gate block.

Namely, between the reference characters A and B, such selective determinations can be made, respectively, that: only the low pass filter 12 is connected; only the high pass filter 14 is connected; the low pass filter 12 and the high pass filter 14 are serially connected to each other; and both the low pass filter 12 and the high pass filter 14 are made to be not connected.

Therefore, according to the third embodiment of the present invention, the connecting relationship in the analog circuit, such as between the low pass filter, the high pass filter and the like, can be changed. For example, when a plurality of serial connections are made of the third embodiments of the present invention, cutoff characteristics of the filters can be made variable by changing the arrangement of the stages of filters.

Figure 7:
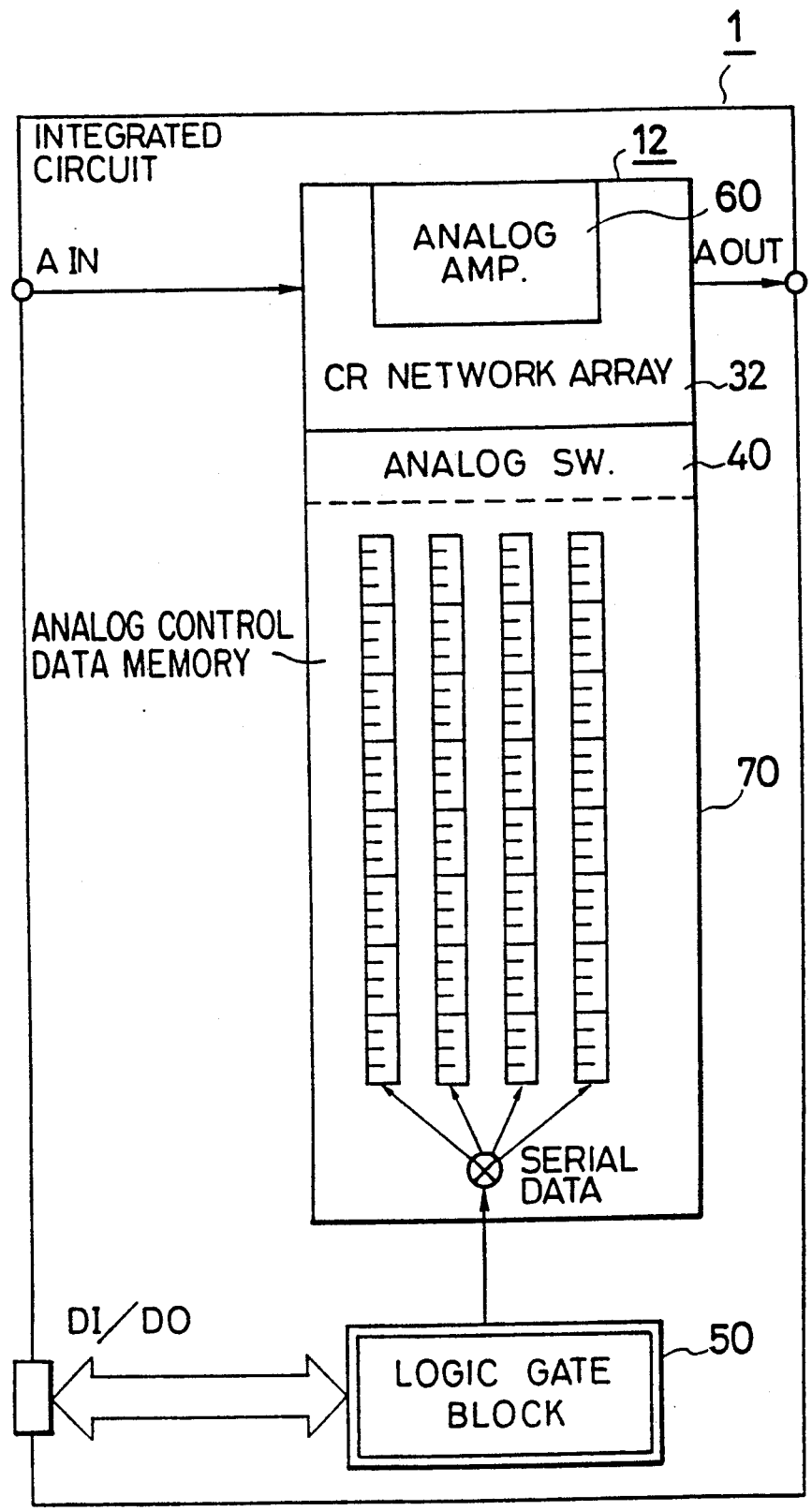
FIG. 7 is a block diagram showing a fourth embodiment of the present invention.

FIG. 7 is a block diagram showing a fourth embodiment of the present invention.

Referring to this FIG. 7, reference characters 50, 60, AIN, AOUT and DI/DO designate having the same reference characters in FIG. 4.

The CR network array 32 of the variable characteristics low pass filter 12 of the integrated circuit 1 as shown in FIG. 7 is constituted by the total four of the C arrays or R arrays so as to change characteristics of two stage connected FIG. 5 circuits, for example.

In these C arrays or R arrays, the resistance values or the capacitance values can be widely varied by the analog switch 40 in response to the digital signals of 32 bits, respectively. Accordingly, in order to vary the resistance values and the capacitance values of these R arrays and C arrays, the analog switch elements of the analog switch 40 and the memory elements of an analog control data memory 70 amount to the total numbers of 32×4=128, respectively.

As described above, according to the fourth embodiment of the present invention, the logic gate block 50 must set and write the data having a very large number of bits into the analog control data memory 70.

However, in this fourth embodiment of the present invention, the bit data are serially set and written into the analog control data memory 70 form the logic gate block 50. Accordingly, the number of wirings between this logic gate block 50 and the analog control data memory 70 is greatly reduced.

Consequently, according to the fourth embodiment of the present invention, the characteristics of the cutoff frequencies and the mu factor can be adjusted finely, and the number of wirings for this adjusting between the logic gate block 50 and the analog control data memory 70 can be kept low, thus improving the degree of the integration of the integrated circuit.

Figure 8:
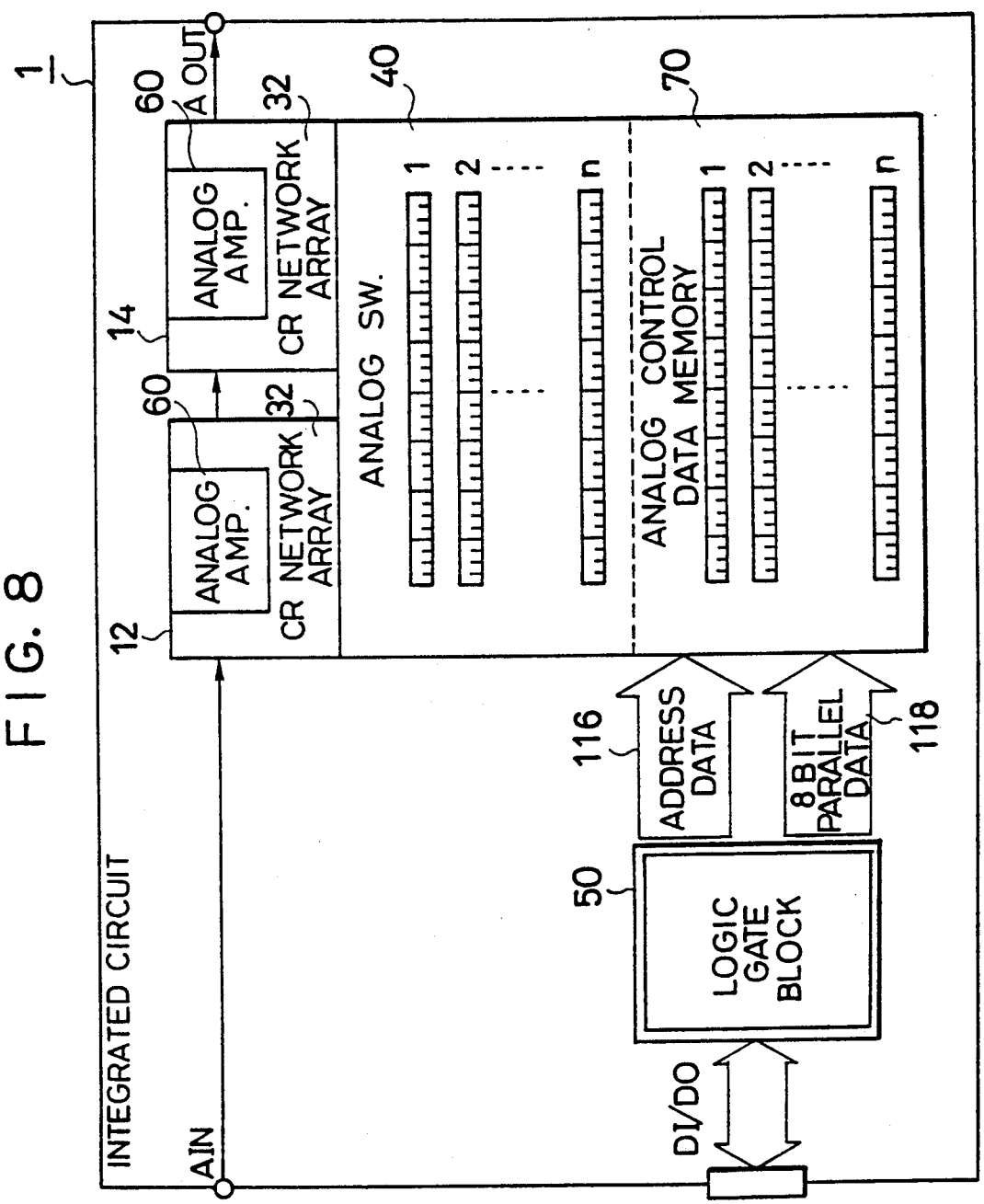
FIG. 8 is a block diagram showing a fifth embodiment of the present invention.

FIG. 8 is a block diagram showing a fifth embodiment of the present invention.

Referring to this FIG. 8, reference characters 50, 60, AIN, AOUT and DI/DO designate those having the same reference characters in FIG. 4.

In the integrated circuit 1 shown in this FIG. 8, between the analog signal input terminal AIN and the analog signal output terminal AOUT, the variable characteristics low pass filter 12 and the variable characteristics high pass filter 14 are serially connected to each other in the described order. In these variable characteristics low pass filter 12 and variable characteristics high pass filter 14, the R arrays or C arrays, totalling to n, are used in the CR network array 32.

Furthermore, in each of these R arrays or C arrays, the resistance values or the capacitance values can be varied in response to the digital signals of 32 bits. Accordingly, the analog switch elements of the analog switch 40 and the memory elements of the analog control data memory 70, which are provided in association with these R arrays or C arrays, are used in the numbers totalling to 32×n, respectively.

Accordingly, in the fifth embodiment of the present invention, the number of bits for performing the write-in of the digital data from the logic gate block 50 to the respective memory elements of the analog control data memory 70 is greatly increased.

However, according to the fifth embodiment of the present invention, by address data 116 and 8 bit parallel data 118, the number of wirings between the logic gate block 50 and the analog control data memory 70 can be greatly reduced.

As has been described hereinabove, according to the fourth and fifth embodiments of the present invention, the number of wirings between the logic gate block 50 and the analog control data memory 70 can be reduced, and moreover, in the respective R arrays and C arrays, the resistance values or the capacitance values can be widely varied by the digital data of multiple bits amounting to 32 bits. Accordingly, with the analog circuit, in which there remain many varied adjustments of "cut and try" such as adjustments of the dynamic range, the filter characteristics (cutoff frequencies and cutoff characteristics) and the offset voltage correction, design can be carried out efficiently, so that the time and cost for development can be greatly reduced.

FIG. 9 is a block diagram showing a sixth embodiment of the present invention.

Referring to this FIG. 9, reference characters AIN, AOUT and DI/DO designate those having the same reference characters in FIG. 1.

In the integrated circuit 1 as shown in this FIG. 9, the variable mu factor amplifier 10 is the same as the variable mu factor amplifier 10 shown in the first embodiment of the present invention. Furthermore, the variable characteristics low pass filter 12 shown in this FIG. 9 is the same as the variable characteristics low pass filter 12 shown in the fourth embodiment of the present invention.

Furthermore, an A/D converter 62 is an A/D converter for converting an analog signal into A/D data 136. Furthermore, a D/A converter 64 is a D/A converter for converting D/A data 138 into an analog signal.

In the integrated circuit 1 shown in this FIG. 9, an analog signal inputted through the analog signal input terminal AIN is converted into an analog signal having a predetermined signal level by the variable mu factor amplifier 10, and thereafter, inputted into the variable characteristics low pass filter 12.

In this variable characteristics low pass filter 12, the cutoff frequencies and the cutoff characteristics are defined or changed by an analog control data setting 132 in accordance with a change or the like in sampling frequencies of the A/D converter 62 by the switching operation 134.

An analog signal outputted from the variable characteristics low pass filter 12 is converted into the A/D data 136 as being a digital data by the A/D converter 62, and inputted into a digital filter 50a in the logic gate block 50.

This digital filter 50a is adapted to realize a filter having a desirable transfer function through addition, multiplication of the digital data, and the delay for a predetermined time and the like. The D/A data 138 outputted from this digital filter 50a is converted into an analog signal by the D/A converter 64, then, turned into the analog signal having a predetermined signal level by the variable mu factor amplifier 10, and thereafter, outputted from the analog signal output terminal AOUT.

The logic gate block 50 for carrying out the aforesaid switching operations 130, 134, 140 and the analog control data setting 132 has a function with which the user can program an optional logic circuit. Furthermore, this logic gate block 50 processes the above-described items while inputting and outputting the digital signals to and from the outside of the integrated circuit 1 through the digital signal input-output terminal DI/DO.

Incidentally, the arrangement of the sixth embodiment of the present invention including the variable mu factor amplifiers 10, the variable characteristics low pass filter 12, the digital filter 50a, the A/D converter 62, the D/A converter 64 and so forth as shown in FIG. 9 is formed by programming through the analog switch elements 40a in the same manner as in the third embodiment of the present invention in FIG. 6.

However, the above-described arrangement may be defined at the time of layout design of the integrated circuit, using a cell library, in which the C array and the R array are registered as basic cells, together with these variable mu factor amplifiers 10, variable characteristics low pass filter 12, digital filter 50a, A/D converter 62, D/A converter 64 and so forth.

In the case wherein the above-described whole arrangement is defined at the time of layout design of the integrated circuit, the number of the analog switch elements on the routes of the analog signals can be reduced, so the S/N ratio can be improved. Incidentally, even in this case, if defining and changing of the finer arrangement are made to be performed by the analog switch elements, then, not only the efficiency of design can be improved, but also defining and changing of the arrangement after the design can be performed.

As has been described hereinabove, according to the sixth embodiment of the present invention, in accordance with the required processing speed and the content of the process during the processes for the respective filters, in either one of an analog electronic circuit and a digital electronic circuit, the arrangement can be selected in the integrated circuit of one chip for every filter processing and the like, the arrangement, the characteristics and the logic circuit can be easily programmed (defined and changed), and an analog-digital composite electronic circuit having high performance can be designed while reducing the time and cost for the development.

Consequently, according to this sixth embodiment of the present invention, even with a video signal process system for improving the picture image quality, the arrangement can be formed of the integrated circuit of one chip.

At the time of design of the above-mentioned video signal process system, the whole system including a provisionally designed circuit portion not completed in design is actually worked at an early stage, whereby the design can be successively continued in the trial and error manner, so that the specification of the circuit can be determined while actually displaying the images to confirm the picture image quality and the responsiveness, thus enabling to perform the design work efficiently for a short period of time.

What is claimed is:

1. A monolithic integrated circuit, comprising:
    a first analog circuit for processing an analog signal;
    a passive electronic element array for changing circuit parameters of said first analog circuit, the passive electronic array comprising at least one capacitance array;
    an analog switch element for switching an analog signal in response to a digital signal to define and change a connection arrangement of said first analog circuit and said passive electronic element array, or to vary circuit parameters defined by said passive electronic element array;
    a second analog circuit for defining and changing a circuit arrangement and circuit characteristics of the integrated circuit; and
    a digital circuit for controlling, defining and changing at least one of the second analog circuit and the analog switch.

2. The integrated circuit as set forth in claim 1, wherein said first analog circuit includes at least one analog amplifier.

3. The integrated circuit as set forth in claim 1, wherein said passive electronic element array includes at least one resistance array.

4. A monolithic integrated circuit, comprising:
    a first analog circuit for processing an analog signal;
    a passive electronic element array for changing circuit parameters of said first analog circuit;
    an analog switch element for switching an analog signal in response to a digital signal to define and change a connection arrangement of said first analog circuit and said passive electronic element array, or to vary circuit parameters defined by said passive electronic element array;
    a second analog circuit for defining and changing a circuit arrangement and circuit characteristics of the integrated circuit; and
    a digital circuit for controlling, defining and changing at least one of the second analog circuit and the analog switch, wherein:
    said second analog circuit includes at least one variable mu-factor amplifier.

5. The integrated circuit as set forth in claim 4, wherein said variable mu factor amplifier comprises an analog amplifier, parallelly connected to a resistance array comprising a feedback resistance of said analog amplifier and an analog switch for selecting a resistance value through taps of said resistance array.

6. A monolithic integrated circuit, comprising:
    a first analog circuit for processing an analog signal;
    a passive electronic element array for changing circuit parameters of said first analog circuit;
    an analog switch element for switching an analog signal in response to a digital signal to define and change a connection arrangement of said first analog circuit and said passive electronic element array, or to vary circuit parameters defined by said passive electronic element array;
    a second analog circuit for defining and changing a circuit arrangement and circuit characteristics of the integrated circuit; and
    a digital circuit for controlling, defining and changing at least one of the second analog circuit and the analog switch, wherein:
    said second analog circuit includes at least one variable reference value comparator.

7. The integrated circuit as set forth in claim 6, wherein said variable reference value comparator comprises an analog amplifier acting as a comparator;
    a serially connected resistance array for dividing a power voltage to generate a reference voltage for said analog amplifier; and
    an analog switch for selecting the reference voltage to be inputted into said analog amplifier through taps of said resistance array.

8. A monolithic integrated circuit, comprising:
    a first analog circuit for processing an analog signal;
    a passive electronic element array for changing circuit parameters of said first analog circuit;
    an analog switch element for switching an analog signal in response to a digital signal to define and change a connection arrangement of said first analog circuit and said passive electronic element array, or to vary circuit parameters defined by said passive electronic element array;

a second analog circuit for defining and changing a circuit arrangement and circuit characteristics of the integrated circuit; and a digital circuit for controlling, defining and changing at least one of the second analog circuit and the analog switch, wherein:

said second analog circuit includes at least one variable characteristics low pass filter for varying at least cutoff frequencies.

9. The integrated circuit as set forth in claim 8, wherein said at least one variable characteristics low pass filter comprises an analog amplifier;

a parallelly connected capacitance array for determining cutoff frequencies of said analog amplifier; and an analog switch for selecting a capacitance value through taps of said capacitance array.

10. A monolithic integrated circuit, comprising:

a first analog circuit for processing an analog signal;

a passive electronic element array for changing circuit parameters of said first analog circuit;

an analog switch element for switching an analog signal in response to a digital signal to define and change a connection arrangement of said first analog circuit and said passive electronic element array, or to vary circuit parameters defined by said passive electronic element array;

a second analog circuit for defining and changing a circuit arrangement and circuit characteristics of the integrated circuit; and a digital circuit for controlling, defining and changing at least one of the second analog circuit and the analog switch, wherein:

said second analog circuit includes at least one low pass filter and at least one high pass filter; and a connecting relationship between the at least one low pass filter and the at least one high pass filter being changeable by said analog switch element, wherein a selection is made from at least one of a connection of one of the at least one low pass filter and at least one high pass, a serial connection of the at least one low pass and at least one high pass filter and a non-connection of the at least one low pass and at least one high pass filter.

11. The integrated circuit as set forth in claim 1, wherein said digital circuit is a logic gate block.

12. The integrated circuit as set forth in claim 1, wherein said analog switch element switches an analog signal in accordance with memory data of a digital memory element provided in association with said analog switch element.

13. The integrated circuit as set forth in claim 12, wherein bit data corresponding to a plurality of digital memory elements are provided in association with a plurality of analog switch elements wherein said bit data are serially written in.

14. The integrated circuit as set forth in claim 12, wherein $m \times n$ of said digital memory elements provided in association with $m \times n$ of said analog switch elements is a memory in which the number of words is m and the number of bits per word is n.

* * * * *